(12) United States Patent
Tsai et al.

(10) Patent No.: US 10,749,008 B2
(45) Date of Patent: Aug. 18, 2020

(54) GATE STRUCTURE, SEMICONDUCTOR DEVICE AND THE METHOD OF FORMING SEMICONDUCTOR DEVICE

(71) Applicant: Taiwan Semiconductor Manufacturing Company, Ltd., Hsinchu (TW)

(72) Inventors: Chun-Hsiung Tsai, Xinpu Township (TW); Kuo-Feng Yu, Zhudong Township (TW); Chien-Tai Chan, Hsinchu (TW); Ziwei Fang, Baoshan Township (TW); Kei-Wei Chen, Tainan (TW); Huai-Tei Yang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 94 days.

(21) Appl. No.: 16/051,002

(22) Filed: Jul. 31, 2018

(65) Prior Publication Data
US 2019/0006483 A1  Jan. 3, 2019

Related U.S. Application Data

(62) Division of application No. 15/062,062, filed on Mar. 5, 2016, now Pat. No. 10,141,417.
(Continued)

(51) Int. Cl.
*H01L 29/66* (2006.01)
*H01L 29/49* (2006.01)
(Continued)

(52) U.S. Cl.
CPC ...... *H01L 29/4966* (2013.01); *H01L 21/2254* (2013.01); *H01L 29/6659* (2013.01);
(Continued)

(58) Field of Classification Search
CPC ............. H01L 29/4966; H01L 21/2254; H01L 29/6659; H01L 29/66545; H01L 29/7833;
(Continued)

(56) References Cited

U.S. PATENT DOCUMENTS 5,756,383 A  5/1998  Gardner
5,811,338 A  9/1998  Kao et al.
(Continued)

FOREIGN PATENT DOCUMENTS

CN  100355046 C  12/2007
CN  104022064 A  9/2014
(Continued)

OTHER PUBLICATIONS

A. P. Huang et al., "Hafnium-based High-k Gate Dielectrics", Source: Advances in Solid State Circuits Technologies, SBN 978-953-307-086-5, pp. 446, Apr. 2010.
(Continued)

*Primary Examiner* — David Vu
(74) *Attorney, Agent, or Firm* — Slater Matsil, LLP (57) ABSTRACT

A gate structure, a semiconductor device, and the method of forming a semiconductor device are provided. In various embodiments, the gate structure includes a gate stack and a doped spacer overlying a sidewall of the gate stack. The gate stack contains a doped work function metal (WFM) stack and a metal gate electrode overlying the doped WFM stack.

20 Claims, 7 Drawing Sheets

Related U.S. Application Data (60) Provisional application No. 62/243,941, filed on Oct. 20, 2015.

(51) Int. Cl.
*H01L 29/78* (2006.01)
*H01L 21/225* (2006.01)

(52) U.S. Cl.
CPC .. *H01L 29/66492* (2013.01); *H01L 29/66545* (2013.01); *H01L 29/7833* (2013.01); *H01L 29/785* (2013.01)

(58) Field of Classification Search
CPC ............. H01L 29/66492; H01L 29/785; H01L 29/66795; H01L 21/324; H01L 21/823468; H01L 29/517; H01L 29/6656; H01L 29/66803; H01L 29/6681
See application file for complete search history.

(56) References Cited

U.S. PATENT DOCUMENTS

| | | | |
|---|---|---|---|
| 5,903,053 | A | 5/1999 | Iijima et al. |
| 5,985,726 | A | 11/1999 | Yu et al. |
| 6,025,232 | A | 2/2000 | Wu et al. |
| 6,417,056 | B1 | 7/2002 | Quek et al. |
| 6,436,800 | B1 | 8/2002 | Kuo et al. |
| 6,583,016 | B1 | 6/2003 | Wei et al. |
| 6,613,657 | B1 | 9/2003 | Ngo et al. |
| 6,627,504 | B1 | 9/2003 | Bertrand et al. |
| 6,639,288 | B1 | 10/2003 | Kunikiyo |
| 6,967,143 | B2 | 11/2005 | Mathew et al. |
| 7,342,289 | B2 | 3/2008 | Huang et al. |
| 7,354,816 | B2 | 4/2008 | Goldbach et al. |
| 7,691,712 | B2 | 4/2010 | Chidambarrao et al. |
| 7,759,748 | B2 | 7/2010 | Yu et al. |
| 8,405,143 | B2 | 3/2013 | Lin et al. |
| 8,524,592 | B1 | 9/2013 | Xie et al. |
| 8,557,692 | B2 | 10/2013 | Tsai et al. |
| 9,064,948 | B2 | 6/2015 | Cai et al. |
| 9,337,057 | B2 | 5/2016 | Park et al. |
| 9,397,003 | B1 | 7/2016 | Niimi et al. |
| 9,646,891 | B2 | 5/2017 | Yang et al. |
| 2004/0029345 | A1 | 2/2004 | Deleonibus et al. |
| 2004/0072395 | A1 | 4/2004 | Liu |
| 2008/0029834 | A1 | 2/2008 | Sell |
| 2008/0042213 | A1 | 2/2008 | Nam et al. |
| 2009/0001480 | A1 | 1/2009 | Cheng |
| 2009/0140317 | A1 | 6/2009 | Rosmeulen |
| 2010/0044806 | A1 | 2/2010 | Hou et al. |
| 2010/0052074 | A1 | 3/2010 | Lin et al. |
| 2011/0031538 | A1 | 2/2011 | Hsieh et al. |
| 2011/0215409 | A1 | 9/2011 | Li et al. |
| 2011/0227170 | A1 | 9/2011 | Zhu et al. |
| 2011/0241085 | A1 | 10/2011 | O'Meara et al. |
| 2011/0254063 | A1 | 10/2011 | Chen et al. |
| 2011/0303951 | A1 | 12/2011 | Zhu et al. |
| 2013/0056836 | A1 | 3/2013 | Yu et al. |
| 2013/0161754 | A1 | 6/2013 | Su et al. |
| 2013/0234254 | A1 | 9/2013 | Ng et al. |
| 2013/0240996 | A1 | 9/2013 | Yin et al. |
| 2013/0241004 | A1 | 9/2013 | Yin et al. |
| 2014/0021517 | A1 | 1/2014 | Cheng et al. |
| 2014/0091395 | A1 | 4/2014 | Liu et al. |
| 2014/0091402 | A1 | 4/2014 | Hou et al. |
| 2014/0103457 | A1 | 4/2014 | Cabral, Jr. et al. |
| 2014/0106531 | A1 | 4/2014 | Cabral, Jr. et al. |
| 2014/0248778 | A1 | 9/2014 | Moll et al. |
| 2015/0061041 | A1 | 3/2015 | Lin et al. |
| 2015/0061042 | A1* | 3/2015 | Cheng ................. H01L 29/4966 257/412 |
| 2015/0076623 | A1 | 3/2015 | Tzou et al. |
| 2015/0243769 | A1 | 8/2015 | Goto et al. |
| 2015/0270177 | A1 | 9/2015 | Tseng et al. |
| 2015/0325684 | A1 | 11/2015 | Xu et al. |
| 2016/0268259 | A1 | 9/2016 | Chang et al. |
| 2016/0276456 | A1 | 9/2016 | Hung et al. |
| 2016/0284820 | A1 | 9/2016 | Basker et al. |
| 2017/0133509 | A1 | 5/2017 | Hsiao et al. |

FOREIGN PATENT DOCUMENTS

| | | |
|---|---|---|
| JP | 2008141178 A | 6/2008 |
| JP | 2009302085 A | 12/2009 |
| JP | 4430669 B2 | 3/2010 |
| KR | 20150096023 A | 8/2015 |

OTHER PUBLICATIONS

Ting, C. Y., "TiN as a High Temperature Diffusion Barrier for Arsenic and Boron", Elsevier Sequoia, Thin Solid Films, 119 (Mar. 20, 1984) 11-21.

Jun Yuan et al., "Nickel Silicide Work Function Tuning Study In Metal-Gate CMOS Applications", Mater. Res. Soc. Symp. Proc. vol. 829, Apr. 29, 2005 Materials Research Society.

* cited by examiner

GATE STRUCTURE, SEMICONDUCTOR DEVICE AND THE METHOD OF FORMING SEMICONDUCTOR DEVICE

PRIORITY CLAIM AND CROSS-REFERENCE

This application is division of U.S. application Ser. No. 15/062,062, filed on Mar. 5, 2016, and entitled "Gate Structure, Semiconductor Device and Method of Forming Semiconductor Device," which application claims the benefit of U.S. Provisional Application No. 62/243,941, filed Oct. 20, 2015, which applications are incorporated herein by reference.

BACKGROUND

The semiconductor industry has undergone exponential growth, constantly progressing in the aim of higher density, device performance and lower costs. Apart from the classical planar transistor such as a metal-oxide-semiconductor field-effect transistor (MOSFET), various non-planar transistors or three-dimensional (3D), such as a fin-like field-effect transistor (FinFET), have been developed to achieve even higher device density as well as to optimize the device efficacy. The fabrication of both planar and 3D FETs is focused on dimension scaling down to increase the packing density of the semiconductor device.

With increasing demands for high-density integration of the planar and 3D FETs, the fabricating method of FinFETs is in great need to be continuously refined so as to attain a more enhanced semiconductor structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a topography region includes aspects having two or more such topography regions, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Although the present disclosure is explained by references of the formation of a semiconductor structure, it will be appreciated that it is equally applicable to any manufacturing process where the semiconductor structure can be advantageously formed.

As aforementioned, it is becoming more challenging for manufacturing a gate structure in a MOSFET or FinFET with the scaling down of dimensions. In the process of forming a gate structure, the first step is to form a dummy gate usually made of polysilicon, followed by the formation of a pair of spacers overlying the sidewalls of the dummy gate. Afterwards, the dummy gate is removed to leave a space and facilitate the filling of an electrode, a work function metal (WFM) stack, and an underlying gate oxide layer to be filled into the space and form the gate structure.

However, as the dimensions of the MOSFET or FinFET are scaled down, the width of the gate stack, or the distance between the spacers, is continually declining, which not only makes it difficult to fill gate materials into the space between the spacers through a gate-filling window after the dummy gate is removed, but also casts negative effects on the performance of the MOSFET or FinFET. Due to the narrowed width of the gate stack, the junction between the source and the drain region is also shortened. The shortened junction gives rise to shortened electron channels.

The shortened channel results in finite sub-threshold slope, affecting the threshold voltage and thus the tunneling of electrons from the source to the drain region when the voltage gap between the source and the drain becomes significant. In other words, off-state leakage currents from the drain to the source region increases, which is also referred to as the drain induction barrier lower (DIBL).

Apart from DIBL, short channel also induces the short circuit between the metal gate and the source/drain region, also contributing to leaked currents. The above influences of the short channel can be collectively called the short channel effect (SCE), which is a major issue concerning the performance of the semiconductor device.

While raising the source/drain (S/D) region by selective epitaxial silicon growth (SEG) can reduce the current leakage, other shortcomings such as the resistance of the S/D region remains. Whereas doping of the S/D region can improve the drawbacks, the thermal process required in doping S/D regions undesirably increases the lateral diffusion of dopants, thereby increasing the gate to drain overlap capacitance. Also, to compensate for the dopant loss in the S/D region owing to the thermal process, higher implantation dosage in the S/D region can be adopted. Nonetheless, the increased concentration of dopants in the S/D region not only brings about deeper S/D junction depth ($X_j$). The deeper the junction depth, the more significant the short channel effect.

While the formation of ultra-shallow junctions (USJ) can counter the effect of increasing junction depth, higher dopant implant concentrations are required to avoid an increase in parasitic resistances at shallower junction depths. The dopant implantation required to form the ultra-shallow junctions is difficult, and causes damage to the substrate by forming amorphous or disordered lattice regions, rendering the problem unsolved. Therefore, it is of great necessity to continually improve the method for manufacturing a MOSFET or FinFET with scaled down dimensions to overcome the short channel effect.

In order to solve the above-mentioned problems, the present disclosure provides a gate structure, a semiconductor device and a method for forming the semiconductor device, which includes a doped spacer and a doped oxide layer to conquer the short channel effect in MOSFETs or FinFETs. In this way, despite the scaling down of MOSFET or FinFET dimensions, the packing density and performance of semiconductor devices can be improved.

Figure 1A:
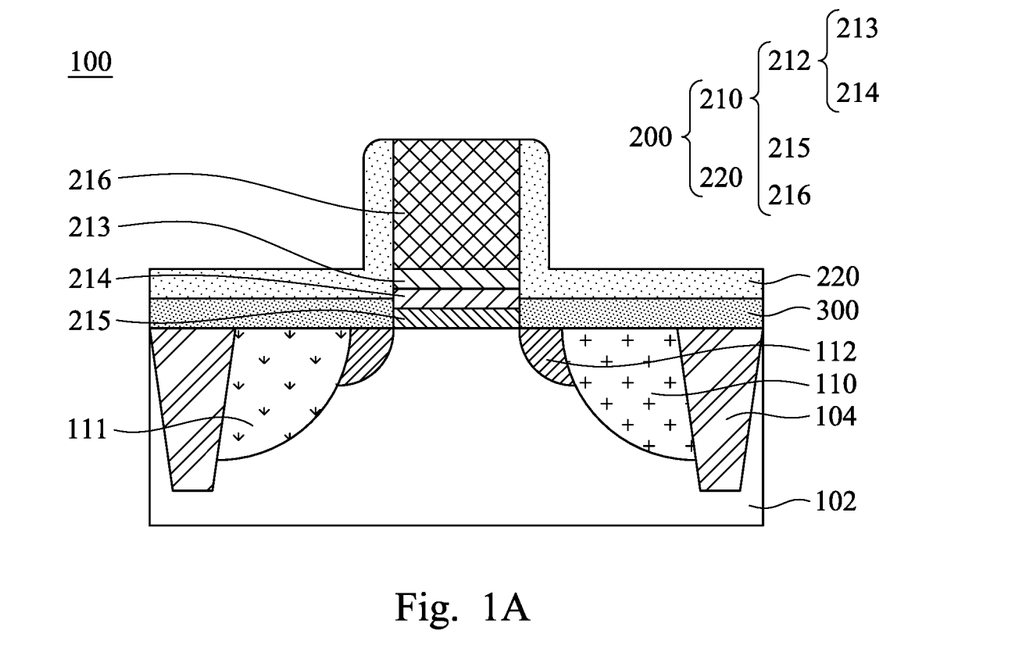
FIGS. 1A and 1B are cross sectional views of a semiconductor device in accordance with some embodiments.
Figure 1B:
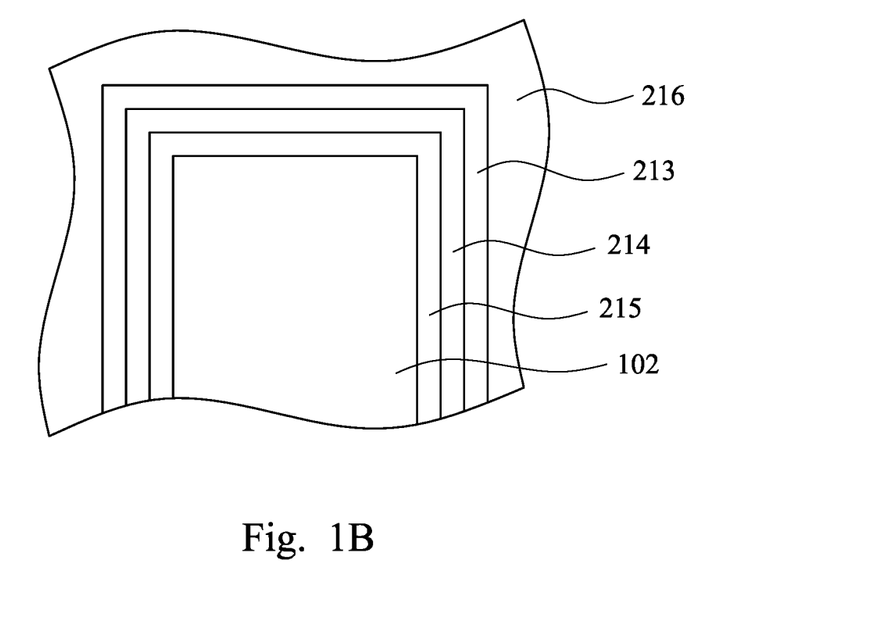

With reference to FIG. 1A and FIG. 1B, wherein FIG. 1B illustrates a cross-section of FIG. 1A in embodiments for a FinFET, there is illustrated cross sectional view of schematic area arrangement of a semiconductor device 100 in accordance with some embodiments. The semiconductor device 100, also referred to as a field-effect transistor (FET) in some embodiments, includes a gate structure 200.

In various embodiments, the gate structure 200 includes a gate stack 210 and a spacer 220' overlying a sidewall of the gate stack 210. The gate stack 210 may include a gate electrode, a work function metal (WFM) stack 212' underlying the gate electrode, and a gate oxide layer 215' underlying the work function metal (WFM) stack 212'. In some embodiments, the gate stack 210 can be formed via any appropriate methods, which includes deposition, photolithography patterning, and etching. The deposition methods include chemical vapor deposition (CVD), physical vapor deposition (PVD), atomic layer deposition (ALD), and the combinations thereof.

In various embodiments, a current can be exerted onto the gate electrode. Once an input current from the gate electrode reach a threshold voltage ($V_t$), negative charges may accumulate accordingly beneath the gate oxide layer 215', and an electron channel between a source region 110 and a drain region 111, also referred to as the source/drain (S/D) region, can be induced beneath the gate structure 200.

In some embodiments, the threshold voltage of the gate structure 200 is mainly determined by the work function metal (WFM) stack 212'. The work function indicates the minimal thermodynamic work or energy to remove an electron from a solid surface to a close position under the influence of the adjacent electric fields. Thus, the work function metal stack 212' modulates the threshold voltage tuning by affecting the free energy of electrons underlying the gate stack 210.

In some embodiments, the gate electrode may be initially formed of polycrystalline-silicon (poly-Si) or poly-crystalline silicon germanium (poly-SiGe). However, threshold voltage instability and leakage currents can be induced if the poly-Si gate electrode is combined with the gate oxide made of silicon dioxide ($SiO_2$). Thus, the gate electrode may eventually be replaced by a metal material to improve threshold voltage modulation and semiconductor device performance. In various embodiments, the materials for the metal gate electrode 216 include tantalum (Ta), tantalum nitride (TaN), niobium (Nb), tantalum nitride (TaN), tantalum carbide (TaC), tungsten (W), tungsten nitride (WN), tungsten carbide (WC), and any suitable metals or combinations thereof.

In addition, to fully conquer the above issue, the introduction of metal gate electrodes 216 would need to be accompanied by simultaneous introduction of the gate oxide layer 215' with high dielectric constant (high K). In various embodiments, oxides such as lanthanum oxide ($La_2O_3$) is appropriate for a N-type FET (nFET) since lanthanum (La) is strongly electro-positive metals. On the other hand, aluminum oxide ($Al_2O_3$) is appropriate for a P-type FET (pFET) due to the ability to prevent the extrinsic work function shifts. Generally, the gate oxide layer 215' can be made of dielectric materials such as aluminum oxide ($Al_2O_3$), lanthanum oxide ($La_2O_3$), tantalum oxide ($Ta_2O_5$), titanium oxide ($TiO_2$), hafnium oxide ($HfO_2$), silicon dioxide ($SiO_2$), hafnium silicon oxide (HfSiO), zirconium oxide ($ZrO_2$), and any suitable metals or a combination thereof.

Due to the shift from the low-k/poly-Si gate to the high-k/metal gate, the work function metal stack 212' needs to be modified accordingly to meet the threshold voltage requirements of the gate structure 200. With an upper mid-gap work function, highlighted thermal stability, and distinct diffusion features, titanium nitride (TiN) serves as a suitable candidate for the WFM. Modification of the work function of TiN to obtain the desirable effective work function (EWF) is pivotal for gate stack enhancement of two-dimensional MOSFETs and three-dimensional FinFETs. Besides increasing the thickness of the TiN layer to elevate the EWF in the WFM stack, introducing another layer of high-k work function metal such as a titanium silicon nitride (TiSiN) layer, can further fine-tune the EWF.

Hence, in various embodiments, the WFM stack 212' includes a TiN layer 213' and a TiSiN layer 214' underlying the TiN layer 213'. The TiSiN layer 214' can function in coordination with the underlying gate oxide layer 215' to improve the performance of the gate structure 200, since both the TiSiN layer 214' and the gate oxide layer 215' are amorphous with a high dielectric constant, usually higher than the dielectric constant of silicon dioxide, or 3.9.

In terms of a long-channel transistor, the threshold voltage is determined by the charge conservation applied to the channel between the source/drain regions and characteristics of the work function metals (WFM) including the TiN layer and the TiSiN layer. Whereas, with the scaling down of semiconductor devices, there is a constant decrease in the width of the gate structure 200 and the thickness of the gate oxide layer 215', along with closer junctions between the S/D regions, resulting in short-channel transistors. In terms of the short-channel transistors, a roll-off in threshold voltage occurs as the channel length is reduced, and thus the threshold voltage is not only affected by the WFM stack 212', but also affected by the closer junctions.

To offset the short channel effect (SCE) and hot carrier effect (HCE) in short-channel transistors, a portion of the S/D region underlying the gate structure 200 is lightly doped, forming a lightly-doped drain/source (LDD) region 112, also referred to as the source/drain extension (SDE) region. However, merely doping the LDD region 112 manifests limited influences on countering the SCE, and even more limited effect on control of threshold voltage in short channel devices.

Modulation of the threshold voltage is further improved by doping the WFM stack 212'. For a N-type transistor (nFET), if the TiSiN layer 214' and the TiN layer 213' in the WFM stack 212' are doped by N-type dopants, the threshold voltage can be lowered. In contrast, if the TiSiN layer 214' and the TiN layer 213' in the WFM stack 212' are doped by P-type dopants, the threshold voltage can be elevated. For a P-type transistor (pFET), the modulation of the threshold voltage is reversed. To achieve the doping of the WFM stack 212', extra layers are required to serve as the dopant donors in the gate structure 200.

In accordance with various embodiments, a spacer 220' overlying a sidewall of the gate stack 210 is formed. A high concentration of the dopant is sealed in the spacer 220' to form a doped spacer 220, serving as a dopant donor to the WFM stack 212'. If the gate stack 210 and a substrate 102 underlying the gate stack 210 form a N-type transistor, the doped spacer 220 is doped with boron (B) or other P-type dopants to increase the threshold voltage and diminish leakage currents from SCE. If the gate stack 210 and a substrate 102 underlying the gate stack 210 forms a P-type transistor, the doped spacer 220 is doped with arsenic (As) or other N-type dopants to raise the threshold voltage and offset leakage currents from SCE.

The doping concentration of the doped spacer 220 is about $5 \times 10^{20}$ atoms/cm$^3$ to about $5 \times 10^{21}$ atoms/cm$^3$ to provide sufficient dopants into the WFM stack 212'. In some embodiments, the doped spacer 220 is made of dielectric materials including silicon nitride (SiN), silicon oxynitride (SiON), silicon carbide (SiC), silicon oxycarbide (SiOC), silicon carbon oxynitride (SiCON), silicon oxyfluoride (SiOF), or a combination thereof.

In some embodiments, the solid-phase diffusion (SFD) of dopants from the doped spacer 220 to the WFM stack 212' is facilitated by a set of thermal processes, giving rise to the doped work function metal (WFM) stack 212 including the doped TiSiN layer 214 and the doped TiN layer 213 and the doped gate oxide layer 215. Since the dopant in the doped WFM stack 212 is the same as in the doped oxide layer 300 and in the doped spacer 220, the dopant is boron in a NMOS and a N-type FinFET, while the dopant is arsenic in a PMOS and a P-type FinFET. In some embodiments, the doped WFM stack 212 is doped at a concentration lower than the concentration of the doped spacer 220, or lower than about $5 \times 10^{20}$ atoms/cm$^3$ to about $5 \times 10^{21}$ atoms/cm$^3$ due to diffusion gradient.

The solid-phase diffusion (SFD) of dopants from the doped spacer 220 into the WFM stack can occur in different types of FET depending on the profile of the substrate 102 underlying the gate stack 210. In some embodiments, the substrate 102 contains a source region 110 and a drain region 111, which can be collectively called the source/drain (S/D) regions. The substrate 102 may be embedded in a basal layer (not shown), and the gate stack 210 may thus lie over the basal layer and a top surface of the substrate 102 between the source region 110 and a drain region 111, which forms a planar integrated circuit structure, also referred to as a MOSFET.

In some other embodiments, the substrate 102 with the source region 110 and the drain region 111 is a raised region overlying the basal layer, forming a three-dimensional fin structure. The gate stack 210 lies over the basal layer and one or more raised fin structures, forming a three-dimensional integrated circuit structure, also referred to as a FinFET.

In some embodiments, the material of the substrate 102 includes silicon, silicon germanium, silicon carbide, gallium arsenic, gallium phosphide, indium phosphide, indium arsenide, indium antimonide, an alloy semiconductor including SiGe, GaAsP, AlInAs, AlGaAs, GaInAs, GaInP, GaInAsP, or combinations thereof. In various embodiments, different sets of S/D regions can be isolated by a shallow trench isolation (STI) region adjacent to the S/D regions. The STI region may be made up of a dielectric material, such as silicon oxide, silicon nitride, silicon oxynitride, fluoride-doped silicate glass, and combinations thereof.

The substrate 102 may be fabricated by any suitable processes, such as photolithography and etching. The photolithography may include forming a photoresist layer (not shown) over the substrate 102 (e.g., spin-on coating), soft baking, mask aligning, patterning the photoresist layer by exposure, operating post-exposure baking, and developing the pattern to form a photoresist mask used as a protection of the substrate while etching is performed to form the substrate 102.

To further encompass the WFM stack 212', an oxide layer 300' may be formed on the substrate 102 to cover exposed surface of the substrate 102 in some embodiments. In other words, the oxide layer 300' is formed on the surface of the substrate 102 encompassing the gate stack 210, or the surface of the substrate 102 not in contact with the gate stack 210. To also serve as a dopant donor to the WFM stack 212', the oxide layer 300' is also doped with a high concentration of dopants to form a doped oxide layer 300. When the gate stack 210 and a substrate 102 underlying the gate stack 210 forms a nFET, such as a N-type MOSFET (NMOS) or a N-type FinFET, the doped oxide layer 300 is doped with boron (B) or other P-type dopants. When the gate stack 210 and a substrate 102 underlying the gate stack 210 forms a pFET, such as a P-type MOSFET (PMOS) or a P-type FinFET, the doped oxide layer 300 is doped with arsenic (As) or other N-type dopants.

The doping concentration of the doped oxide layer 300 is about $5 \times 10^{20}$ atoms/cm$^3$ to about $5 \times 10^{21}$ atoms/cm$^3$ to provide sufficient dopants into the WFM stack 212' and contribute to the formation of the doped WFM stack 212. In some embodiments, the doped oxide layer 300 is made of dielectric materials such as aluminum oxide (Al$_2$O$_3$), lanthanum oxide (La$_2$O$_3$), lanthanum aluminum oxide (AlLaO$_3$), tantalum oxide (Ta$_2$O$_5$), titanium oxide (TiO$_2$), hafnium oxide (HfO$_2$), silicon dioxide (SiO$_2$), hafnium silicon oxide (HfSiO), and zirconium oxide (ZrO$_2$).

Figure 2:
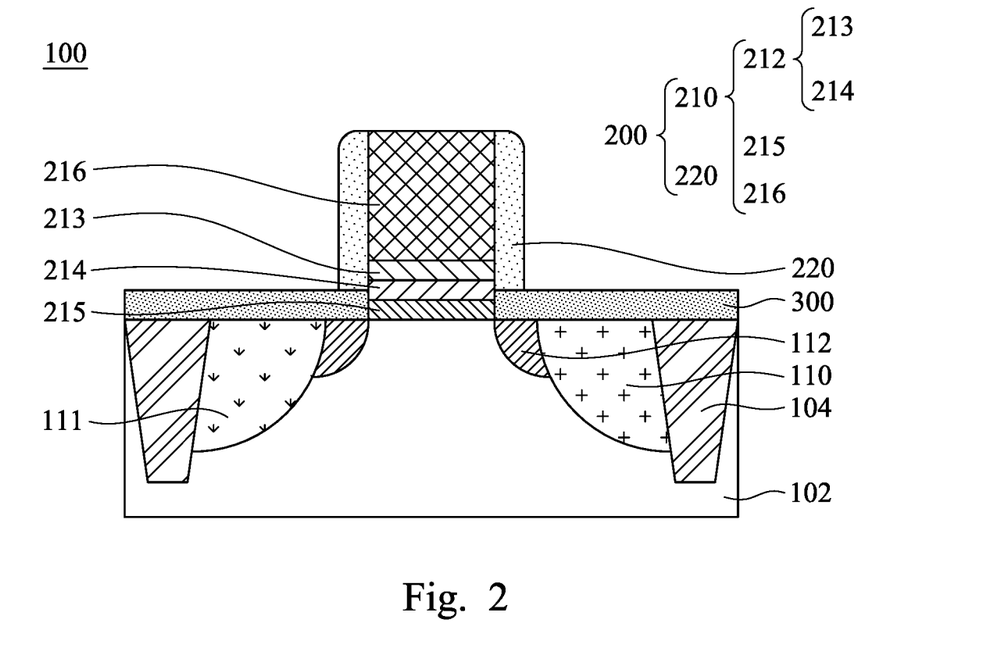
FIG. 2 is a cross-sectional view of another semiconductor device in accordance with some other embodiments.

Referring next to FIG. 2, there is a cross-sectional view of another semiconductor device in accordance with some embodiments. The substrate 102 contains the source region 110, the drain region 111, a set of the LDD regions 112, and a set of the STI regions 104. In some embodiments, the gate structure 200 overlies the substrate 102 between the source region 110 and the drain region 111. To be more specific, the gate structure 200 overlies the substrate 102 between two LDD regions 112. The doped oxide layer 300 is formed on the substrate 102 encompassing the gate structure 200, more specifically between two STI regions 104.

In various embodiments, the gate stack 210 includes a metal gate electrode 216, a doped work function metal (WFM) stack 212 underlying the metal gate electrode 216, and a doped gate oxide layer 215 underlying the doped work function metal (WFM) stack 212. In some embodiments, the doped spacer 220 overlies only the sidewall of the gate stack 210 and a portion of the doped oxide layer 300 adjacent to the sidewall of the gate stack 210. Since both the doped oxide layer 300 and the doped spacer 220 can serve as the dopant donor, and the portion of the doped spacer 220 overlying the sidewall of the gate stack 210 and the doped oxide layer 300 can fully cover the WFM stack 212', the portion of the doped spacer 220 overlying the doped oxide layer 300 becomes optional because it is not in direct contact with the WFM stack 212'. In other words, in some embodiments, the doped oxide layer 300 is not covered by the doped spacer 220 except for that of the doped oxide layer 300 adjacent to the gate stack 210. To put it differently, the doped spacer 220 includes a portion overlying a sidewall of the gate stack 210 and the doped oxide layer 300 adjacent to the gate stack 210, and a portion overlying the doped oxide layer 300 not adjacent to the gate stack 210. Since the portion of the doped spacer 220 overlying the doped oxide layer 300 not adjacent to the gate stack 210 is not in contact with the WFM stack 212', the portion cannot serve as the dopant donor, and thus the portion is optional. In various embodiments, the doped oxide layer 300 adjacent to the gate stack 210 overlies the LDD region 112, while the doped oxide layer 300 not adjacent to the gate stack 210 overlies the S/D region and the STI region 104.

Figure 3:
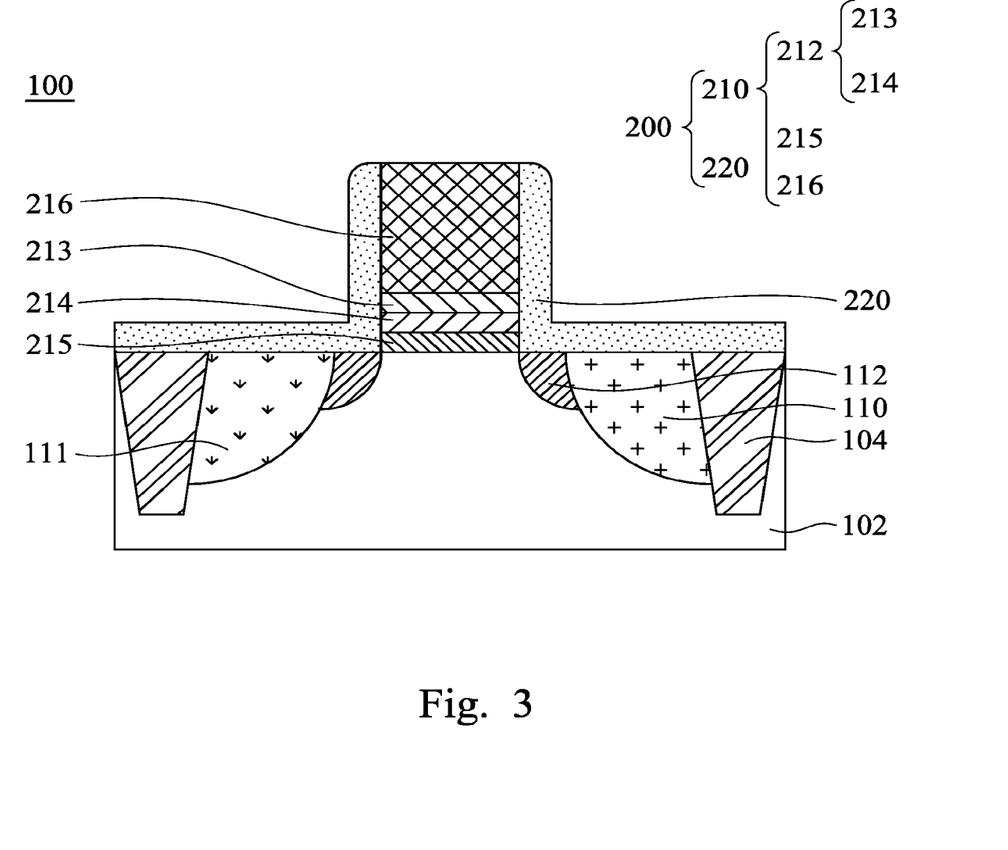
FIG. 3 is a cross-sectional view of yet another semiconductor device in accordance with yet some other embodiments.

With Reference to FIG. 3, there is a cross-sectional view of yet another semiconductor device in accordance with some embodiments. The substrate 102 includes the source region 110, the drain region 111, LDD regions 112 between the source/drain region, and a set of the STI regions 104 adjacent to the source/drain region. The gate structure 200 overlies the substrate 102 between the source region 110 and the drain region 111. To be more specific, the gate structure 200 is formed over the substrate 102 between two LDD regions 112.

In some embodiments, the doped spacer 220 overlies the sidewall of the gate stack 210 and the substrate 102 between the two STI regions 104. Since that both the doped spacer 220 the doped oxide layer 300 and can serve as the dopant donor, and that the dielectric function of the doped gate oxide layer 215 can substitute for the dielectric function of the doped oxide layer 300, the doped oxide layer 300 becomes optional. To put it differently, the doping function of the doped oxide layer 300 may be replaced by the doped spacer 220 once the doped spacer 220 overlies the substrate 102, and thus the doped oxide layer 300 may be optional. To put it differently, in some other embodiments, the semiconductor device 100 does not include the doped oxide layer 300, and the doped spacer 220 overlies both the sidewall of the gate stack 210 and the surface of substrate 102. (See FIG. 3).

Figure 4:
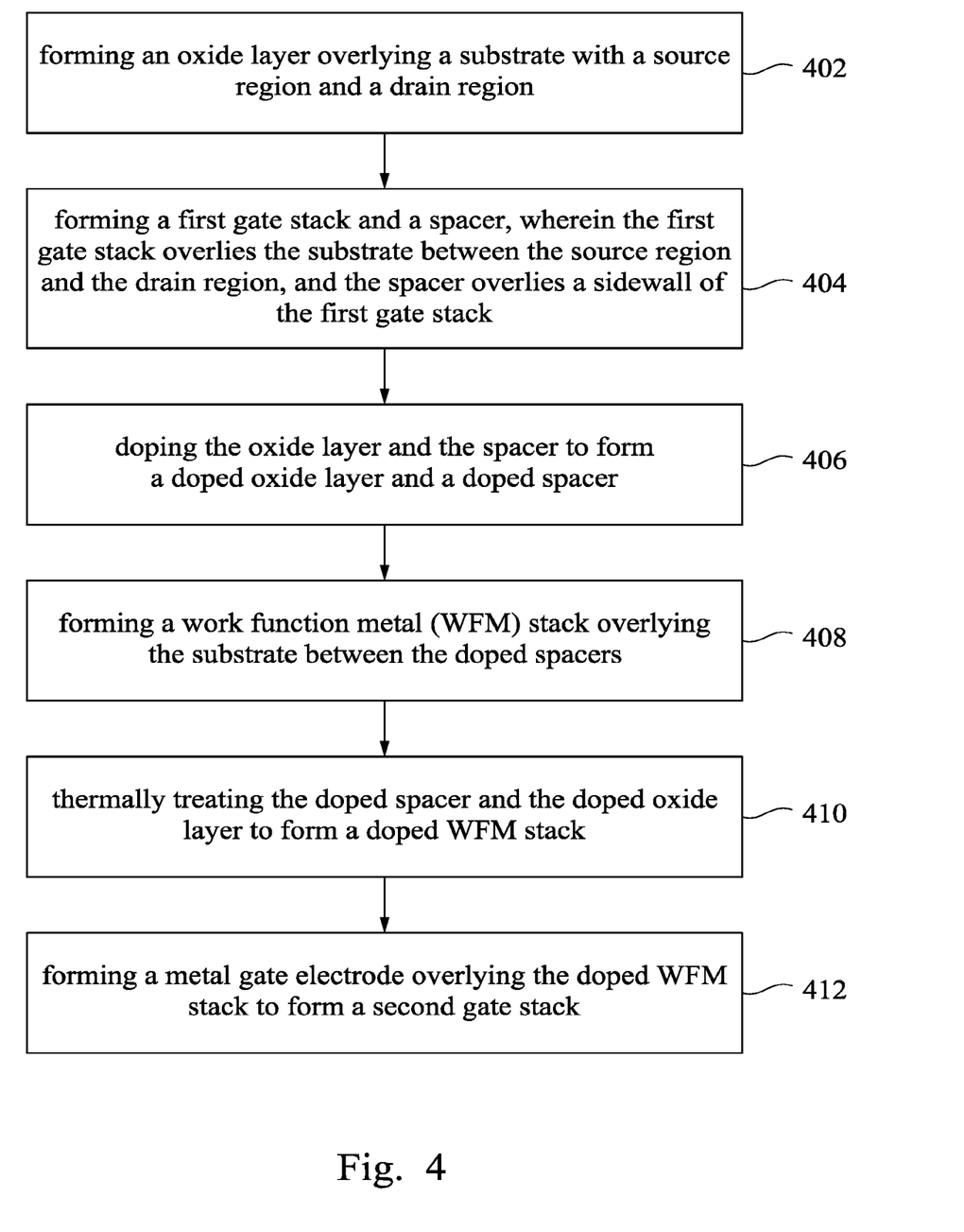
FIG. 4 is a process flow diagram of forming a semiconductor device, in accordance with some embodiments.

Referring next to FIG. 4, there is illustrated a process flow diagram of forming a semiconductor device in accordance with some embodiments. In forming the semiconductor-device 100, a substrate 102 with a source region 110 and a drain region 111 therein is provided, and a procedure 402 of forming an oxide layer 300' overlying the substrate 102 is performed. After appropriate removal of a portion of the oxide layer 300', a first gate stack 211 can be formed over the substrate 102 between the source region 110 and a drain region 111, and a spacer 220' can be formed over a sidewall of the first gate stack 211, both of which are included in the procedure 404.

In various embodiments, after the formation of the oxide layer 300', the first gate stack 211, and the spacer 220', the procedure 406 of doping the oxide layer 300' and the spacer 220' is then carried out to transform the oxide layer 300' and the spacer 220' into the dopant donor. After the doping process, the procedure 408 of forming a WFM stack 212' as the dopant acceptor is performed. Then, the procedure 410 of a thermal treatment to the doped oxide layer 300 and the doped spacer 220 is operated to drive the solid-phase diffusion (SPD) of dopants from the doped oxide layer 300 and the doped spacer 220 to the WFM stack 212'. Following the thermal diffusion process is the procedure 412 of forming a metal gate electrode 216 overlying the doped WFM stack 212 to form a second gate stack.

Figure 5A:
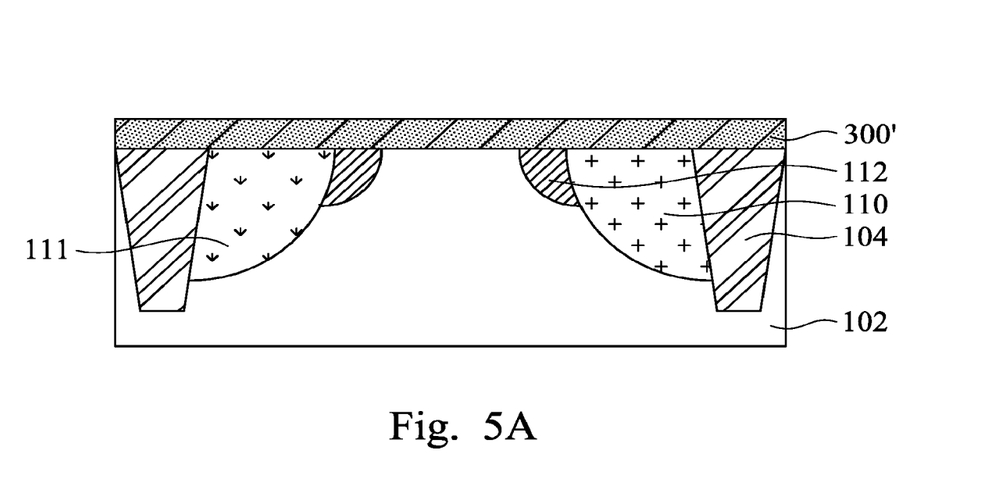
FIG. 5A through 5F are cross-sectional views at various stages of a method for forming a semiconductor device in accordance with some embodiments.

With Reference to FIG. 5A, a substrate 102 with a source region 110, a drain region 111, a pair of lightly doped source/drain (LDD) regions 112 adjacent to the inner sidewall of the source region 110 and the drain region 111, and a pair of shallow trench isolation (STI) regions adjacent to the outer sidewall of the source region 110 and the drain region 111 is provided. The first step of forming the semiconductor-device 100 is to form an oxide layer 300' over the substrate 102. The forming methods includes chemical vapor deposition (CVD), plasma-enhanced CVD (PECVD), atomic-layer CVD (ALCVD), low-pressure CVD (LPCVD), any other appropriate deposition methods and combinations thereof.

Figure 5B:
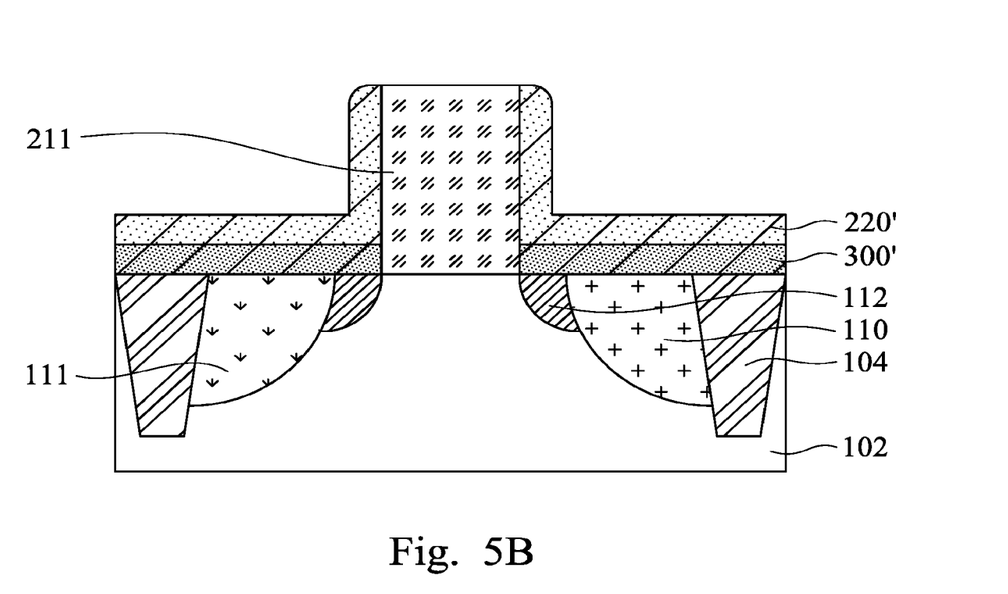

Referring next to FIG. 5B, the oxide layer 300' may undergo photolithography to etch away a portion of the oxide layer 300' overlying the substrate 102 between the source region 110 and the drain region 111 and leave a space for the first gate stack 211 to be formed on the substrate 102 between the source region 110 and the drain region 111. The photolithography may include forming a photoresist layer (not shown) over the oxide layer 300', mask aligning, patterning the photoresist layer by exposure, and developing the pattern to form a photoresist mask. The photoresist mask is used as a protection of the oxide layer 300' while etching is performed to remove the portion of the oxide layer 300' overlying the substrate 102 between the source region 110 and the drain region 111.

After etching of the oxide layer 300', the portion of substrate 102 between the source region 110 and the drain region 111 is exposed, where the first gate stack 211 can be formed. The first gate stack 211 can also be referred to as the dummy gate stack, which can be made of materials such as polycrystalline-silicon (poly-Si), poly-crystalline silicon germanium (poly-SiGe), silicon nitride (SiN), and combinations thereof. Following the formation of the first gate stack 211, a spacer 220' may be formed along a sidewall of the first gate stack 211 and overlies the surface of the oxide layer 300'. The forming methods includes chemical vapor deposition (CVD), plasma-enhanced CVD (PECVD), atomic-layer CVD (ALCVD), low-pressure CVD (LPCVD), any other appropriate deposition methods and combinations thereof.

Figure 5C:
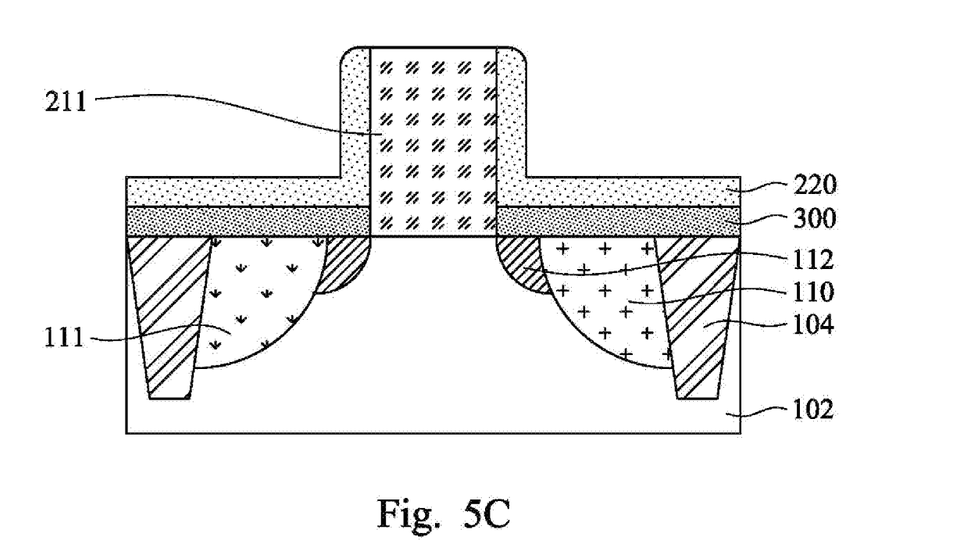

Referring next to FIG. 5C, the spacer 220' may be doped with a dopant such as boron (B) or arsenic (As) at the concentration of about $5\times10^{20}$ atoms/cm$^3$ to about $5\times10^{21}$ atoms/cm$^3$ to form a doped spacer 220 and serve as a dopant donor to the WFM stack. The spacer 220' can be doped by any appropriate doping methods including the in-situ doping by the atomic layer deposition (ALD), or ex-situ doping by the plasma deposition or ion metal plasma (IMP) deposition.

In some embodiments, the oxide layer 300' may be doped with a dopant such as boron (B) or arsenic (As) at the concentration of about $5\times10^{20}$ atoms/cm$^3$ to about $5\times10^{21}$ atoms/cm$^3$ to form a doped oxide layer 300 as a dopant donor to the WFM stack. The doped oxide layer 300' can be doped by any appropriate doping methods including ex-situ doping by the plasma deposition or ion metal plasma (IMP) deposition.

Figure 5D:
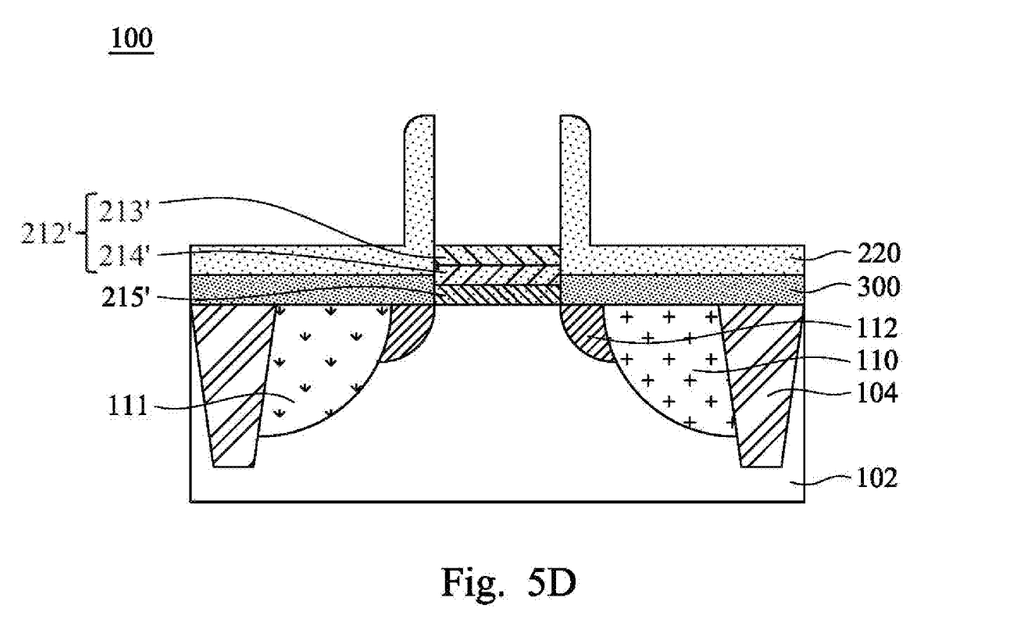

With reference to FIG. 5D, the first gate stack 211 may be removed to expose the substrate between the S/D regions and facilitate the formation of a WFM stack 212' on the exposed surface of the substrate. Prior to forming the WFM stack 212', an epitaxy process, or an epitaxial growth procedure, is carried out to promote the formation of an amorphous gate oxide layer 215'. With a high dielectric constant, or a dielectric constant higher than 3.9, the gate oxide layer 215' serves as an inter-layer dielectric material to modulate the effective work function of the WFM stack. In various embodiments, a WFM stack 212' is formed on the gate oxide layer 215' by first depositing a TiSiN layer 214', followed by depositing a TiN layer 213' on the TiSiN layer 214'.

Figure 5E:
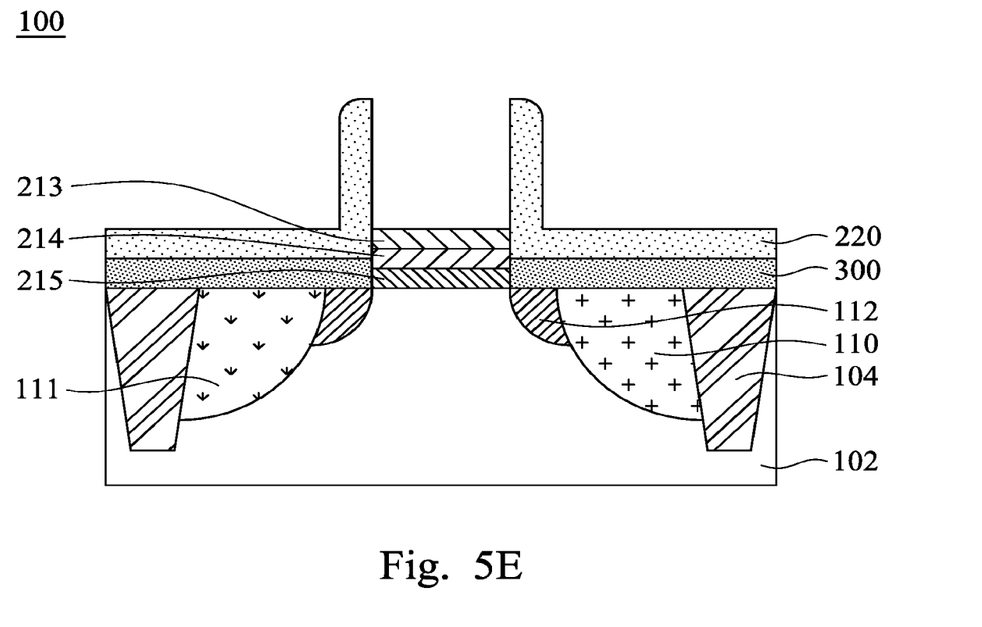

Referring next to FIG. 5E, the doping of the WFM stack 212' and the gate oxide layer 215' is performed by a thermal process. The thermal process can be further divided into two phases: the post-metal annealing (PMA) and the post-cap annealing (PCA). The post-metal annealing (PMA) is carried out directly after the formation of the WFM stack 212' to facilitate the solid-phase diffusion of dopants from the doped spacer 220 and the doped oxide layer 300 into the TiN layer 213' of the WFM stack 212'. In various embodiments, the post-metal annealing (PMA) is performed at a temperature of about 750° C. to about 900° C. for about 1 second to about 30 seconds to rapidly drive dopants into the WFM stack 212' while preventing undesirable out-diffusion of dopants from LDD regions 112.

After the PMA, a dummy gate electrode usually made of poly-Si, also referred to as a Si cap (not shown), may be deposited onto the TiN layer 213' for further thermal process. In some embodiments, the post-cap annealing (PCA) is subsequently carried out after forming the Si cap to further drive the dopants from the doped spacer 220 and the doped oxide layer 300 into both the TiN layer 213' and the TiSiN layer 214'. In various embodiments, the post-cap annealing (PCA) is performed at a temperature of about 800° C. to about 1000° C. for about 1 second to about 10 seconds to rapidly drive dopants into the WFM stack 212' while preventing undesirable out-diffusion of dopants from other regions.

The session of the PMA and PCA not only forms a doped WFM stack 212 including a doped TiN layer 213 and a doped TiSiN layer 214, but also form a doped gate oxide layer 215 underlying the doped WFM stack 212. After the formation of the doped WFM stack 212, the Si cap may be removed to expose the top surface of the doped WFM stack 212.

Figure 5F:
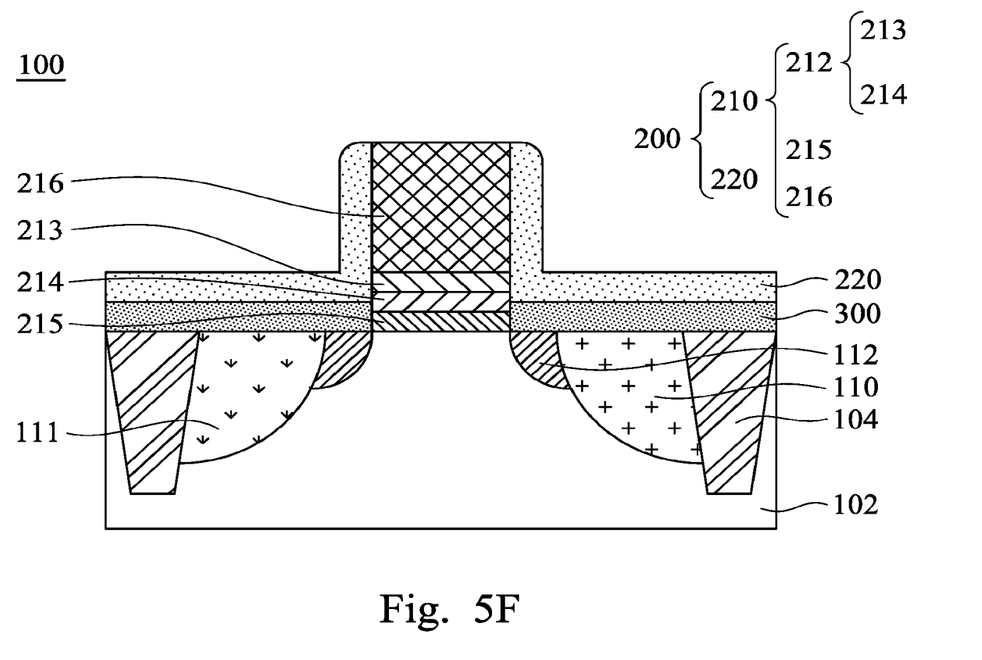

With reference to FIG. 5F, after the removal of the Si cap via appropriate method such as the reactive ion etching (RIE) or the high-density plasma (HDP) etching, a metal gate electrode 216 can be deposited on the doped TiN layer 213 to form a second gate stack, also referred to as the gate stack 210, which is part of the high-k/metal gate structure. In some embodiments, by replacing the Si cap with the metal gate electrode 216, improvement can be achieved in the work function of the doped WFM stack 212 as well as the coordination among the doped WFM stack 212, the metal gate electrode 216, and the doped gate oxide layer 215.

According to the above statements and various embodiments, utilizing the doped spacer 220 and the doped oxide layer 300 to thermally dope the WFM stack 212', while at the same time adopting the high-k gate oxide layer 215' and the metal gate electrode 216, can fine-tune the threshold voltage of the gate structure 200, reduce the leakage currents arising from the short channel effect, and enhance the performance along with high-density integration of the semiconductor device 100.

In accordance with some embodiments, a gate structure 200 includes a gate stack 210 and a doped spacer 220 overlying a sidewall of the gate stack 210. The gate stack 210 contains a doped work function metal (WFM) stack 212 and a metal gate electrode 216 overlying the doped WFM stack 212.

In accordance with some embodiments, a semiconductor device 100 includes a substrate 102, a gate stack 210, a doped spacer 220, and a doped oxide layer 300. The substrate 102 has a source region 110 and a drain region 111, and a gate stack 210 overlying the substrate 102 between the source region 110 and the drain region 111. The gate stack 210 includes a doped gate oxide layer 215, a doped work function metal (WFM) stack 212 overlying the doped gate oxide layer 215, and a metal gate electrode 216 overlying the doped WFM stack 212. The doped oxide layer 300 overlies the surface of the substrate 102. The doped spacer 220 overlying the doped oxide layer 300 and a sidewall of the gate stack 210.

In accordance with some embodiments, a method of forming a semiconductor device 100 includes forming an oxide layer 300' overlying a substrate 102 with a source region 110 and a drain region 111 (procedure 402), forming a first gate stack 211 and a spacer 220'(procedure 404), doping the oxide layer 300' and the spacer 220' to form a doped oxide layer 300 and a doped spacer 220 (procedure 406), forming a work function metal (WFM) stack 212' overlying the substrate 102 between the doped spacers 220 (procedure 408), thermally treating the doped spacer 220 and the doped oxide layer 300 to form a doped WFM stack 212 (procedure 410), and forming a metal gate electrode 216 overlying the doped WFM stack 212 to form a second gate stack 210 (procedure 412). In the procedure 404 of forming a first gate stack 211 and a spacer 220', the first gate stack 211 overlies the substrate 102 between the source region 110 and the drain region 111, and the spacer 220' overlies a sidewall of the first gate stack 211.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a spacer over a semiconductor substrate;
    depositing a first layer in physical contact with both the spacer and a gate dielectric;
    depositing a first conductive layer over the first layer and in physical contact with the spacer;
    performing a first anneal to form a first doped layer from the first layer and a first doped conductive layer from the first conductive layer, wherein the performing the first anneal occurs while the first conductive layer has an exposed top surface; and
    forming a gate electrode over the first doped conductive layer.

2. The method of claim 1, further comprising:
    forming a cap over the first doped conductive layer; and
    removing the cap from over the first doped conductive layer.

3. The method of claim 2, further comprising performing a second anneal after the forming the cap and before the removing the cap.

4. The method of claim 1, wherein the depositing the first layer deposits the first layer in physical contact with a doped oxide layer.

5. The method of claim 4, wherein a portion of the doped oxide layer is free from the spacer.

6. The method of claim 1, wherein the forming the spacer forms the spacer in physical contact with the semiconductor substrate.

7. A method of manufacturing a semiconductor device, the method comprising:
- forming a gate stack over a semiconductor substrate, the gate stack comprising:
  - a gate dielectric;
  - a first layer over the gate dielectric; and
  - a first conductive layer different from the first layer over the first layer;
- forming a doped spacer, wherein after the forming the gate stack the doped spacer is adjacent to both the first layer and the first conductive layer;
- diffusing dopants from the doped spacer into the first layer and the first conductive layer.

8. The method of claim 7, further comprising forming a doped oxide layer, wherein after the forming the gate stack the doped oxide layer is located adjacent to the gate dielectric and the first layer.

9. The method of claim 8, wherein the doped oxide layer comprises aluminum oxide.

10. The method of claim 8, wherein the diffusing the dopants from the doped spacer further diffuses dopants from the doped oxide layer.

11. The method of claim 10, wherein the diffusing the dopants comprises performing a first annealing process.

12. The method of claim 11, wherein the diffusing the dopants further comprises performing a second annealing process different from the first annealing process.

13. The method of claim 7, wherein the forming the doped spacer forms the doped spacer in physical contact with the semiconductor substrate.

14. A method of forming a semiconductor device, the method comprising:
- forming an oxide layer overlying a substrate with a source region and a drain region;
- forming a first gate stack and a spacer, wherein the first gate stack overlies the substrate between the source region and the drain region, and the spacer overlies a sidewall of the first gate stack;
- doping the oxide layer and the spacer to form a doped oxide layer and a doped spacer;
- forming a work function metal (WFM) stack overlying the substrate between the doped spacers;
- thermally treating the doped spacer and the doped oxide layer to form a doped WFM stack; and
- forming a metal gate electrode overlying the doped WFM stack to form a second gate stack.

15. The method of claim 14, wherein the spacer overlies the doped oxide layer.

16. The method of claim 14, wherein thermally treating the doped oxide layer and the doped spacer comprises a process of post-metal annealing (PMA) and a process of post-cap annealing (PCA).

17. The method of claim 16, wherein the post-metal annealing (PMA) is performed at a temperature of about 750° C. to about 900° C. for about 1 second to about 30 seconds.

18. The method of claim 16, wherein the post-cap annealing (PCA) is performed at a temperature of about 800° C. to about 1000° C. for about 1 second to about 10 seconds.

19. The method of claim 14, wherein doping the oxide layer and the spacer comprises in-situ doping of the spacer by atomic layer deposition (ALD) or ex-situ doping of the spacer by plasma deposition or ion metal plasma (IMP) deposition.

20. The method of claim 14, wherein doping the oxide layer and the spacer comprises ex-situ doping of the oxide layer by plasma deposition or ion metal plasma (IMP) deposition.

* * * * *